(12) United States Patent
Fox et al.

(10) Patent No.: US 6,887,716 B2
(45) Date of Patent: May 3, 2005

(54) PROCESS FOR PRODUCING HIGH QUALITY PZT FILMS FOR FERROELECTRIC MEMORY INTEGRATED CIRCUITS

(75) Inventors: Glen Fox, Colorado Springs, CO (US); Fan Chu, Colorado Springs, CO (US); Brian Eastep, Colorado Springs, CO (US); Tomohiro Takamatsu, Iwate (JP); Yoshimasa Horii, Iwate (JP); Ko Nakamura, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/742,204

(22) Filed: Dec. 20, 2000

(65) Prior Publication Data

US 2002/0074601 A1 Jun. 20, 2002

(51) Int. Cl.$^7$ ................................................ H01L 21/00
(52) U.S. Cl. ........................... 438/3; 438/239; 438/240; 438/957
(58) Field of Search ........................... 438/3, 239, 240, 438/957, 197, 381, 396; 257/295, 306

(56) References Cited

U.S. PATENT DOCUMENTS

| | | | |
|---|---|---|---|
| 5,851,841 A | | 12/1998 | Ushikubo et al. |
| 6,090,443 A | | 7/2000 | Eastep .................. 427/255.32 |
| 6,121,648 A | | 9/2000 | Evans, Jr. |
| 6,150,184 A | * | 11/2000 | Evans et al. ................. 438/3 |
| 6,172,386 B1 | | 1/2001 | Jung et al. |
| 6,190,957 B1 | * | 2/2001 | Mochizuki et al. ......... 438/240 |
| 6,284,712 B1 | * | 9/2001 | Otto et al. |
| 6,307,731 B1 | | 10/2001 | Katori |
| 6,316,797 B1 | * | 11/2001 | Van Buskirk et al. ...... 257/295 |
| 6,322,849 B2 | * | 11/2001 | Joshi et al. ................. 438/3 |
| 6,362,503 B1 | * | 3/2002 | Hayashi ..................... 257/310 |
| 6,528,863 B1 | * | 3/2003 | Klee et al. ................... 257/595 |
| 6,653,156 B2 | * | 11/2003 | Hayashi et al. ............... 438/3 |
| 6,682,772 B1 | * | 1/2004 | Fox et al. .................... 427/79 |
| 6,730,523 B2 | * | 5/2004 | Hintermaier et al. ........ 438/3 |
| 6,787,412 B2 | * | 9/2004 | Hashimoto et al. ......... 438/239 |

FOREIGN PATENT DOCUMENTS

| | | |
|---|---|---|
| EP | 0821415 A3 | 1/1998 |
| EP | 0821415 A2 | 1/1998 |
| JP | 04-014472 | 8/1993 |
| JP | 05-137579 | 12/1994 |
| JP | 07-143243 | 12/1996 |
| JP | 08-181358 | 1/1998 |
| JP | 08-351916 | 6/1998 |
| WO | WO 0001000 | 1/2000 |
| WO | WO 0033361 | 6/2000 |

OTHER PUBLICATIONS

Fujimori, Y., Takeda, T., Nakamura, T., and Takasu, H., Low Voltage Operation of the Ferroelectric Pb(Zr, Tl) O$_3$ Capacitors Derived by Sol–Gel Method, 1999, pp. 400–401.

* cited by examiner

*Primary Examiner*—W. David Coleman
*Assistant Examiner*—Khiem Nguyen
(74) *Attorney, Agent, or Firm*—Peter J. Meza, Esq.; William J. Kubida, Esq.; Hogan & Hartson L.L.P.

(57) ABSTRACT

A method for fabrication of ferroelectric capacitor elements of an integrated circuit includes steps of deposition of an electrically conductive bottom electrode layer, preferably made of a noble metal. The bottom electrode is covered with a layer of ferroelectric dielectric material. The ferroelectric dielectric is annealed with a first anneal prior to depositing a second electrode layer comprising a noble metal oxide. Deposition of the electrically conductive top electrode layer is followed by annealing the layer of ferroelectric dielectric material and the top electrode layer with a second anneal. The first and the second anneal are performed by rapid thermal annealing.

20 Claims, 3 Drawing Sheets

PROCESS FOR PRODUCING HIGH QUALITY PZT FILMS FOR FERROELECTRIC MEMORY INTEGRATED CIRCUITS

FIELD OF THE INVENTION

The invention relates to the field of ferroelectric memory integrated circuit processing. In particular the invention relates to deposition and annealing process steps for forming the dielectric and electrode layers of ferroelectric capacitors in ferroelectric memory integrated circuits.

BACKGROUND OF THE INVENTION

Standard Dynamic Random Access Memory (DRAM) and Static Random Access Memory (SRAM) devices are considered volatile memory devices because data stored therein is lost when power is lost. Nonvolatile memory devices are those that can retain data despite loss of power.

At present, there is a strong market for EEPROM (Electrically Erasable, Programmable Read Only Memory), and Flash EEPROM nonvolatile memory devices. These devices tend to be slow to write-, often having write times on the order of milliseconds, while read times range generally between one nanosecond and one microsecond. The great difference between read and write times, together with the block-erase character of Flash EEPROM, complicates design of some systems. CMOS SRAM or DRAM with battery backup power for data retention can provide symmetrical, fast, read and write times in nonvolatile memory but is expensive, requires presence of a battery, and limits system life or requires eventual battery replacement.

It is known that Ferroelectric Random Access Memory (FRAM) is a nonvolatile memory technology having potential for both read and write times below one microsecond. FRAM nonvolatile memory devices based on Lead Zirconium Titanate (PZT) ferroelectric storage capacitors as memory elements integrated with CMOS addressing, selection, and control logic are known in the art and are commercially available. PLZT is a Lanthanum-doped form of PZT wherein some of the lead is replaced with Lanthanum, for purposes of this patent the term PZT includes PLZT. It is known that PZT may additionally be doped with strontium and calcium to improve its ferroelectric dielectric properties. Ferroelectric storage capacitors having a Strontium Bismuth Tanatalate (SBT) dielectric are also known in the art. For purposes of this patent the term Ferroelectric Dielectric includes both PZT and SBT materials.

It is expected that FRAM devices having smaller device geometries and smaller ferroelectric storage capacitors than currently available devices will offer greater speed and storage density at lower cost. Producing such FRAM devices requires production of improved, uniform, high quality, ferroelectric storage capacitors integrated with CMOS addressing and control logic.

It is known that some prior FRAM devices incorporate ferroelectric storage capacitors that degrade with repeated operation, this is known as fatigue degradation. Some prior FRAM devices incorporate complex circuitry for overcoming fatigue degradation, thereby complicating the design of the device. It is expected that improved, high quality ferroelectric storage capacitors may also permit production of FRAM devices that do not suffer from fatigue degradation without need of complex circuitry.

Ferroelectric storage capacitors of FRAM devices have a bottom electrode interfacing with a ferroelectric layer, often PZT or SBT, that serves as the ferroelectric dielectric. The ferroelectric layer is typically deposited on top of the bottom electrode, and a top electrode is deposited on top of the ferroelectric layer. Each layer is masked and etched to define the size and location of each capacitor. A passivation layer is formed over the resulting capacitors. This layer is masked and etched to allow connection of each capacitor to other components of each memory cell and to other components, such as CMOS addressing, selection, and control logic of the integrated circuit.

A prior process for fabricating the ferroelectric dielectric of ferroelectric storage capacitors is described in U.S. Pat. No. 6,090,443, (the '443 patent) entitled "Multi-Layer approach for optimizing Ferroelectric Film Performance" and assigned to Ramtron International Corporation, Colorado Springs, Colo., the disclosure of which is incorporated herein by reference. This process involves the following steps, including a two-step Rapid Thermal Anneal (RTA), all performed after deposition of a bottom electrode layer:

Sputter deposition of a metallic bottom electrode layer.

Sputter deposition of a lead-rich PZT nucleation layer.

Sputter deposition of a bulk PZT layer.

Optional sputter deposition of a lead-rich PZT cap layer. The PZT nucleation, bulk, and cap layers can alternatively be deposited by a spin-on process, and are calcium and strontium doped.

Annealing the deposited PZT by RTA in argon atmosphere to form intermetallic phases at the bottom electrode interface at 625 C for 90 seconds, RTA being performed by an AG Heatpulse 410 RTA unit.

Annealing the deposited PZT by RTA in oxygen atmosphere to crystallize the PZT at 750 C for 20 seconds.

Depositing a top electrode layer.

Furnace annealing the resulting structure prior to testing at 650 C for one hour.

While the process of the '443 patent can produce PZT films improved over prior art, there was still room for improvement in PZT quality and process complexity.

SUMMARY OF THE INVENTION

The foregoing and other features, utilities and advantages of the invention will be apparent from the following more particular description of a preferred embodiment of the invention as illustrated in the accompanying drawings.

High quality PZT ferroelectric storage capacitors for ferroelectric memory devices are formed by a process of:

Deposition of a Platinum (Pt) bottom electrode layer on a partially-processed CMOS integrated circuit wafer.

Sputter deposition of a lead-rich PZT nucleation layer.

Sputter deposition of a bulk PZT layer. The PZT nucleation and bulk layers can alternatively be deposited by a spin-on process, and are lanthanum, calcium and strontium doped.

Alternatively, a single PZT layer may be deposited.

Annealing the deposited PZT by RTA in argon atmosphere to form perovskite phases at about 575 C for about 90 seconds. An atmosphere of five percent Oxygen in Argon is used at atmospheric pressure. This step is a first PZT anneal.

Depositing a top electrode layer of Iridium Oxide (IrOx). This step must follow the first PZT anneal because otherwise the substantial shrinkage that occurs during first PZT anneal could disrupt the IrOx layer.

Annealing the deposited PZT and the top electrode layer together by RTA in argon-oxygen atmosphere to complete crystallization of the PZT at about 750 C for about 20 seconds. This is a second PZT anneal, and is performed in an environment of argon with some oxygen.

Photomasking and etching steps as known in the art to remove undesired portions of the top electrode layer, the recrystalized PZT, and the bottom electrode layer.

Depositing a passivation layer.

Photomasking and etching the passivation layer to permit connection of other circuit elements to the resulting ferroelectric storage capacitors.

It has been found that a top electrode layer, if deposited prior to the step of annealing the deposited PZT and the top electrode layer together by RTA to complete crystallization of the PZT, protects the PZT and encourages production of a high quality PZT layer.

It was, however, found that if the step of annealing the deposited PZT and the top electrode layer together by RTA is performed in a gas mixture having a high partial pressure of oxygen, nodules formed on the top electrode layer. These nodules have potential to interfere with later processing steps, it is therefore preferable that their formation be prevented. It was found that if the step of annealing the deposited PZT and the top electrode layer together by RTA is performed in a gas mixture of about one percent oxygen in an otherwise inert atmosphere, such as argon gas, this nodule formation is inhibited.

Deposition of the top electrode layer prior to second-stage anneal therefore helps produce high-quality ferroelectric capacitors.

It has also been found that an alternative process wherein the step of annealing the deposited PZT and the top electrode layer together by RTA is performed after photomasking and etching of the top electrode layer can also produce quality ferroelectric capacitors. Further, alternative processes wherein the step of annealing the deposited PZT and the top electrode layer together by RTA is further delayed until after the passivation layer is deposited and optionally masked, and etched, can also produce quality ferroelectric capacitors.

DETAILED DESCRIPTION

Figure 1:
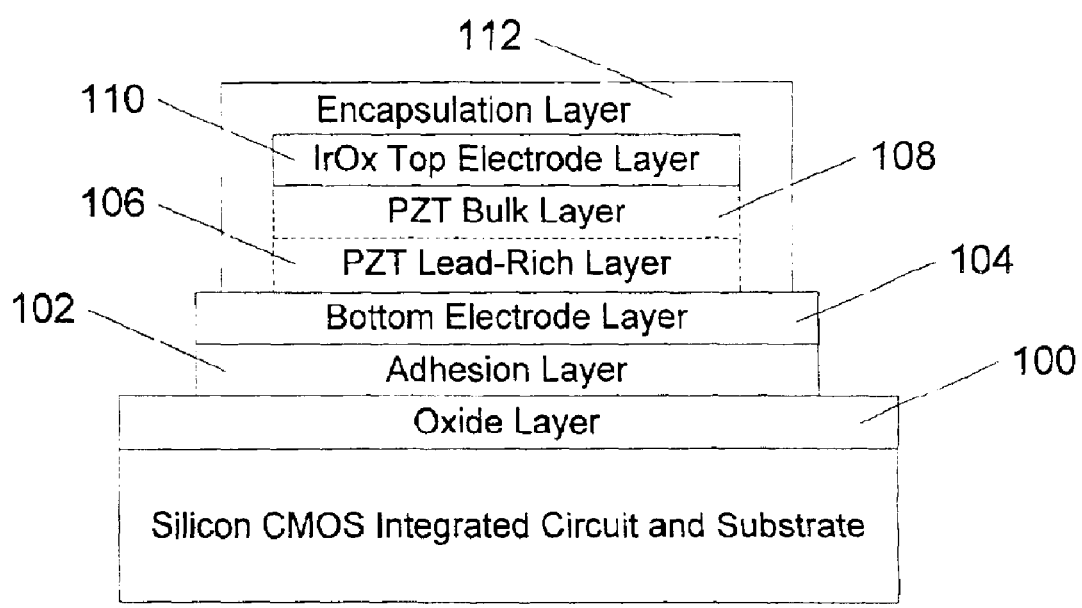
FIG. 1 is a cross section of a ferroelectric capacitor on a CMOS circuit fabricated according to the present invention.
Figure 2:
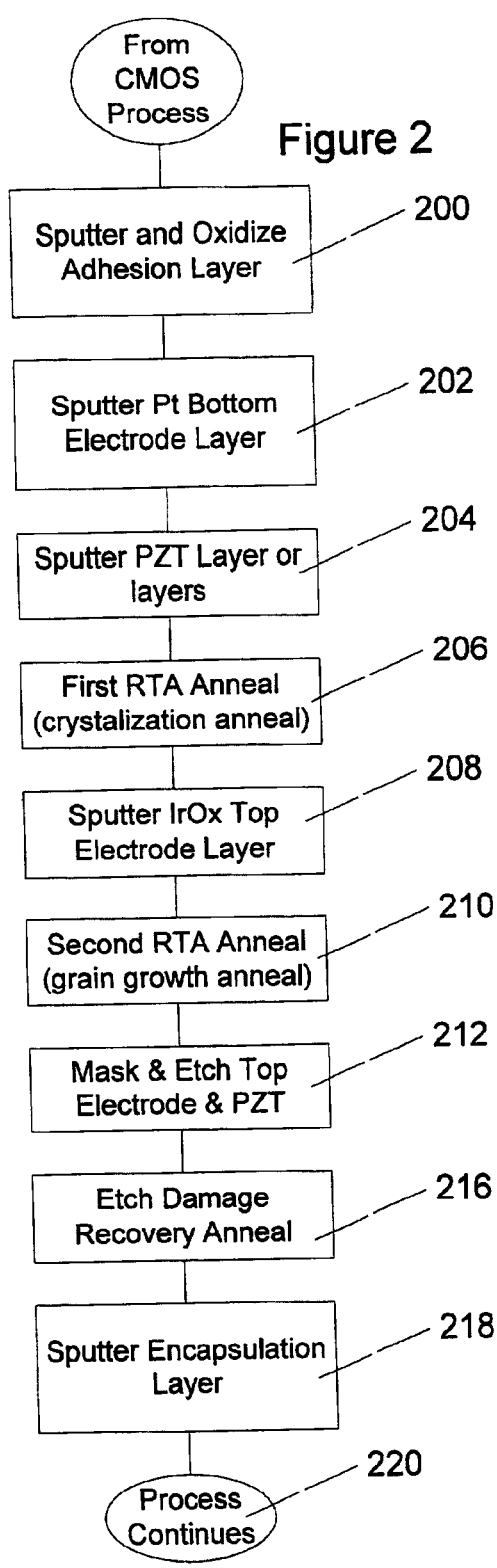
FIG. 2 is a process flowchart, illustrating deposition of the top electrode layer between a first RTA anneal and a second RTA anneal, the second RTA anneal followed by etching of the PZT and a furnace recovery anneal.

With reference to FIGS. 1 and 2, a ferroelectric capacitor is typically grown on top of a thermal oxide layer 100 of a partially-finished CMOS integrated circuit wafer. On this oxide layer is sputtered 200 a layer of Titanium from fifty to two hundred, preferably two hundred, angstroms thick. This titanium layer is oxidized at from 300 to 700 degrees C., with 700 degrees C. preferred, for from ten minutes to one hour in oxygen atmosphere to form a adhesion layer 102 of titanium dioxide that enhances adhesion, and thereby prevent delamination, of following layers.

On the oxidized titanium adhesion layer 100 is sputtered 202 a Platinum bottom electrode layer 104 from 500 to 2500 angstroms thick, with 1000 angstroms thickness preferred for optimum electrode quality. For optimum electrode quality, and optimum quality of following PZT layers, this layer is deposited by DC sputtering with a substrate temperature of 450 to 600 degrees C. For purposes of this application, a noble metal is platinum, iridium, palladium, or another metal largely comprised of an element located in the same region of the periodic table as platinum, iridium, and palladium.

Next, one or more layers of lanthanum doped PZT ferroelectric dielectric is deposited. This may be a single layer of thickness about one thousand eight hundred angstroms of PZT, preferably modified with calcium and strontium dopants to obtain desirable electrical properties. Alternatively, a lead-rich, lanthanum doped, PZT ferroelectric thin film 106 of thickness about one hundred fifty angstroms is sputtered 204, preferably lanthanum doped and modified with calcium and strontium dopants. PZT as deposited has lead composition of 1.05 to 1.3 times the stoichiometric ratio for PZT. This lead-rich layer is then topped with a further sputtered 206 bulk PZT layer 108 approximately one thousand six hundred fifty angstroms thick, giving a total PZT thickness of about one thousand eight hundred angstroms. PZT deposition is preferably done by RF sputtering on substrate having a temperature approximately twenty-five degrees C. PZT deposition may also be done by the sol-gel method as described on pages 400–401 of the Extended Abstracts of the 1999 International Conference on Solid State Devices and Materials, Tokyo, 1999.

The PZT is next annealed 208 by rapid thermal annealing (RTA) at a temperature between five hundred twenty five and six hundred degrees and preferably about five hundred seventy-five degrees C. for from sixty to one hundred twenty seconds, with ninety seconds preferred. This anneal is conducted in a low vacuum, or largely inert gas atmosphere, thereby having less oxygen than ambient air. It is desirable that the atmosphere used for the anneal contain an oxygen partial pressure no more than ten percent of one atmosphere. A mixture of approximately 5% O2 in Argon at atmospheric pressure has been successfully used. This step is referenced herein as a first stage anneal, or a crystalization anneal.

For purposes of this application, the term noble gas is helium, argon, neon, or any other gases having similar properties and similarly situated in the periodic table. The term inert gas comprises any gas that does not significantly chemically react with the surface of an integrated circuit under conditions of the anneal, and includes noble gas. The term low vacuum includes conditions of gas mixtures comprising inert gas, air, and/or oxygen at total pressure significantly less than one atmosphere.

The partially annealed PZT is next capped with a sputtered 210 amorphous Iridium Oxide (IrOx) top electrode layer 110 of thickness from five hundred to two thousand angstroms, with a preferred thickness of one thousand five hundred angstroms. This electrode is deposited by DC sputtering on a substrate at room temperature. For purposes of this application, a noble metal oxide is an oxide of a noble metal as heretofore defined, including platinum and iridium oxides. Iridium Oxide has been found to be particularly effective as a top electrode layer because the IrOx top electrode layer effectively seals and protects the PZT layer during a second anneal and later processing stages, thereby producing a higher quality PZT layer in finished ferroelectric capacitors than otherwise.

After the top electrode layer 110 is sputtered 210, the top electrode layer and underlying PZT are annealed 212 together by rapid thermal anneal at a temperature and for a duration sufficient for grain growth of the PZT to complete. This anneal is performed at a temperature of over six hundred twenty five degrees C, generally being performed between seven hundred and seven hundred fifty degrees C. A temperature of 725 degrees for approximately twenty seconds has produced good results. Anneal times of more than ten seconds are required to avoid excessive variation in the anneal process, and less then forty seconds are preferred as longer anneal is unnecessary. This step is referred to herein as a second anneal, or a grain growth anneal. The second anneal is performed in a gas mixture having an oxygen partial pressure of less than five percent of an atmosphere, and preferably approximately one percent of an atmosphere. This partial pressure is preferably obtained through a mixture of an inert gas and one percent oxygen at room pressure, although it is expected that low vacuum may also be used. The inert gas utilized comprises argon, although it is expected that other inert gas, including the noble gasses neon and helium, may also serve.

In the process of FIG. 2, it was found that oxygen present during the second anneal at partial pressures significantly greater than the range specified caused nodules to form on the IrOx top electrode layer. These nodules had potential to interfere with further processing of the device.

It has been observed that the described process results in a well-defined interfaces between the bottom electrode, ferroelectric dielectric, and top electrode layers. In particular, the ferroelectric dielectric layer shows clearly defined grains having a typically columnar structure.

Next, the top electrode and PZT layers are subjected to masking and etching steps 214 to define individual ferroelectric capacitors as known in the art.

An etch damage recovery furnace anneal 216, in the temperature range of five hundred to seven hundred degrees C., preferably six hundred fifty degrees C. for one hour, is then performed as with a standard FRAM process.

An encapsulation layer 112, which may comprise PZT, aluminum oxide, or other materials as known in the art, is then deposited 218. Processing continues 220 as known in the art to mask and etch the bottom electrode layer, and mask and etch contact holes in the encapsulation layer. Processing is also continued to deposit, mask, and etch the interconnect dielectric, passivation and metalization layers typical of CMOS integrated circuits to interconnect the resulting ferroelectric capacitors and other components of the circuit to produce a Ferroelectric RAM integrated circuit.

Figure 3:
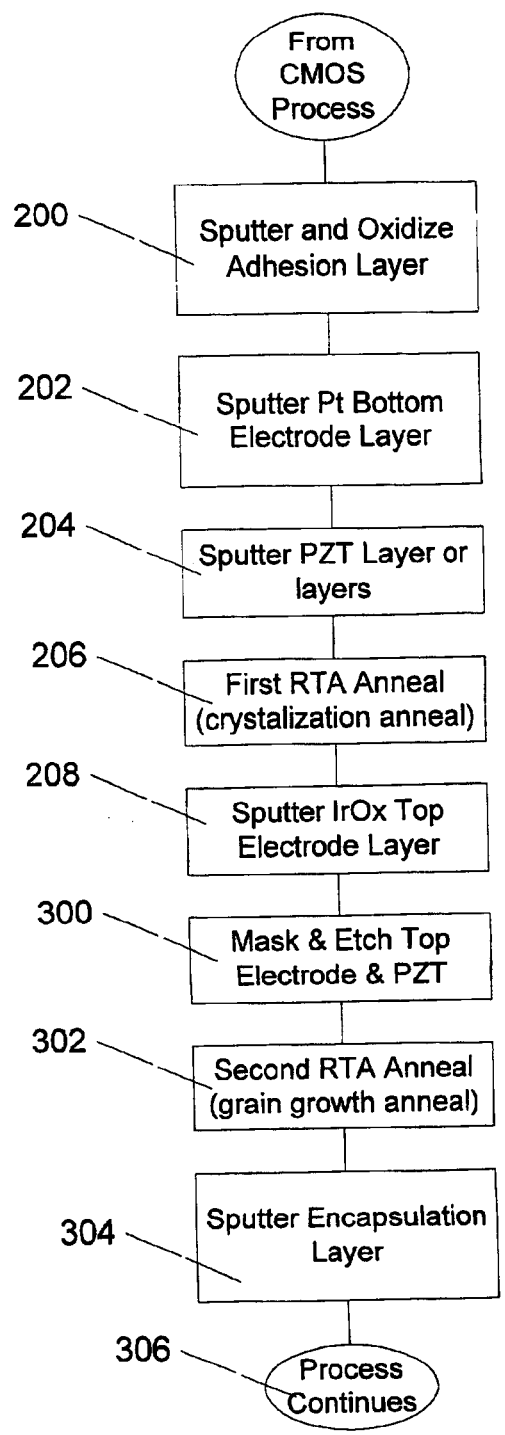
FIG. 3 is a process flowchart illustrating an alternative process wherein the top electrode layer is deposited following a first RTA anneal, and a second RTA anneal is performed after etching of the PZT.

In an alternative process, FIG. 3, the initial processing steps of sputtering and oxidizing a adhesion layer 200, sputtering a bottom electrode layer 202, sputtering one or more layers of PZT ferroelectric material 204, performing a first RTA anneal 206, and sputtering an IrOx top electrode layer 208 are identical with the initial processing steps of the process of FIG. 2. In this alternate process, the step of sputtering an IrOx top electrode layer 208 is followed not by a second RTA anneal but by the masking and etching steps for defining regions for the top electrode and PZT layers 300. These masking and etching steps are followed by the second RTA anneal 302.

This second RTA anneal 302, or grain grown anneal, anneals the top electrode layer and underlying PZT together by rapid thermal anneal at a temperature and for a duration sufficient for grain growth of the PZT to complete. This anneal is at a temperature of greater than six hundred twenty five degrees C., generally being performed between seven hundred and seven hundred fifty degrees C. A temperature of seven hundred twenty five degrees for approximately twenty seconds has produced good results. Anneal times of more than ten seconds are required to avoid excessive variation in the anneal process, and less then forty seconds are preferred as longer anneal is unnecessary.

With this alternative process of FIG. 3 the etch damage recovery anneal 216 of the process of FIG. 2 is no longer necessary and may be eliminated. The second RTA anneal 302 is therefore followed by sputtering of the encapsulation layer 304, and processing continues 306 as with the process of FIG. 2. The encapsulation layer may comprise either aluminum oxide or PZT.

Figures 4, 5:
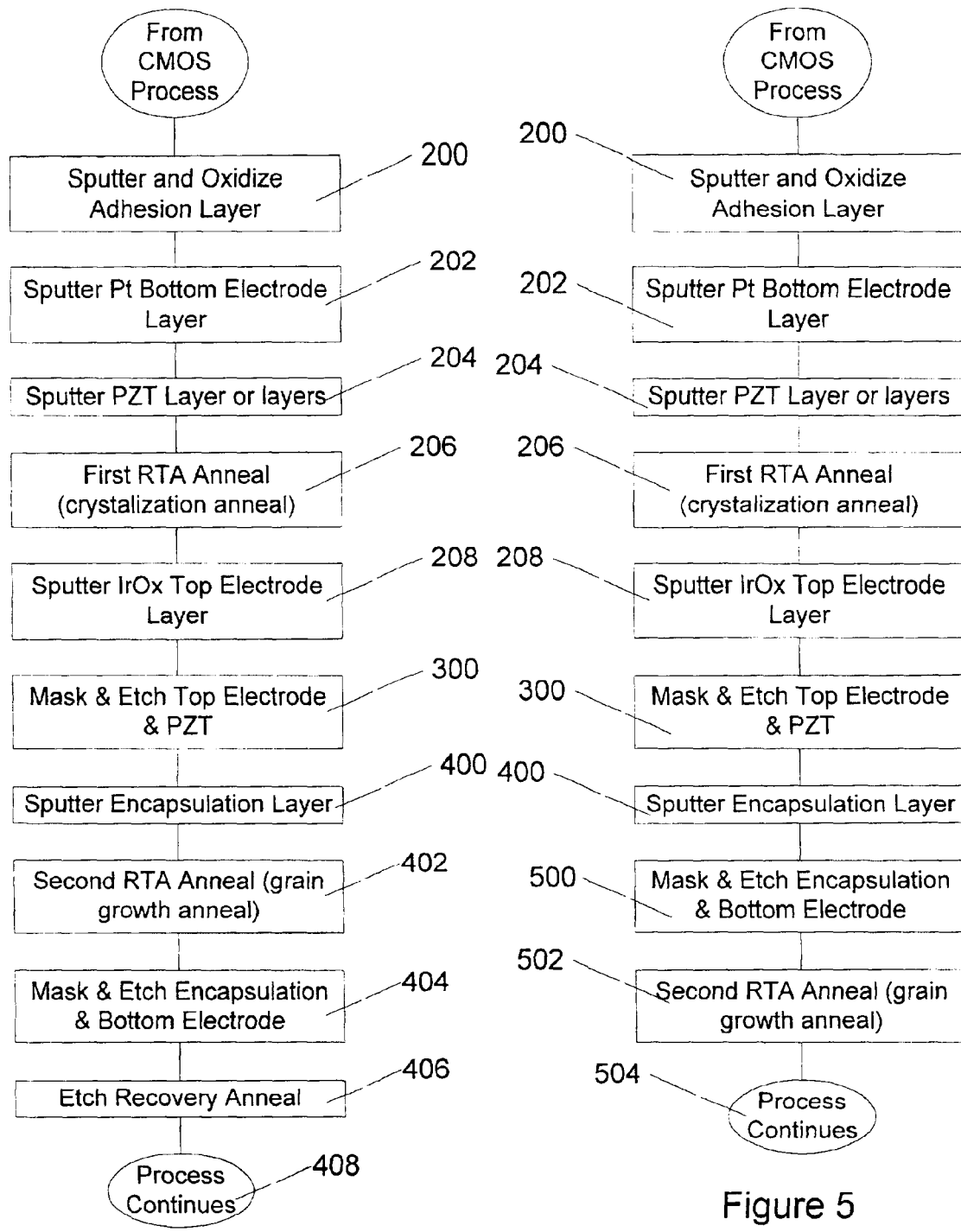
FIG. 4 is a process flowchart illustrating an alternative process wherein the top electrode layer is deposited following a first RTA anneal, and a second RTA anneal is performed after etching of the PZT and deposition of an encapsulation layer.
FIG. 5 is a process flowchart of an alternative process similar to the process shown in FIG. 4, with the exception that the step of sputtering the encapsulation layer is followed by masking and etching of the encapsulation and bottom electrode layers, followed by a second RTA anneal.

In a second alternative process of FIG. 4, the initial processing steps of sputtering and oxidizing a adhesion layer 200, sputtering a bottom electrode layer 202, sputtering one or more layers of PZT ferroelectric material 204, performing a first RTA anneal 206, sputtering an IrOx top electrode layer 208, and masking and etching the top electrode and PZT layers are identical with the initial processing steps of the process of FIG. 3.

These masking and etching steps are followed by sputter deposition of an encapsulation layer 400 without an intervening anneal, then by the second RTA anneal 402.

This second RTA anneal 402, or grain grown anneal, anneals the top electrode layer and underlying PZT together by rapid thermal anneal at a temperature and for a duration sufficient for grain growth of the PZT to complete. This anneal is at a temperature of greater than six hundred twenty five degrees C., generally being performed between seven hundred and seven hundred fifty degrees C. A temperature of seven hundred twenty five degrees for approximately twenty seconds has produced good results. Anneal times of more than ten seconds are required to avoid excessive variation in the anneal process, and less then forty seconds are preferred as longer anneal is unnecessary.

With this alternative process of FIG. 4 the etch damage recovery anneal 216 of the process of FIG. 2 is no longer necessary and is eliminated. The second RTA anneal 402 is followed by masking and etching 404 the encapsulation layer 112 and bottom electrode layer 104. These steps are followed by conventional etch recovery oven anneal 406, and continues with processing of contacts and higher interconnect layers 408 as with the process of FIG. 2.

In a third alternative process of FIG. 5, the initial processing steps of sputtering and oxidizing a adhesion layer 200, sputtering a bottom electrode layer 202, sputtering one or more layers of PZT ferroelectric material 204, performing a first RTA anneal 206, sputtering an IrOx top electrode layer 208, masking and etching the top electrode and PZT layers 300, and sputtering 400 the encapsulation layer 112 are identical with the initial processing steps of the process of FIG. 4.

In the process of FIG. 5, the step of sputtering 400 the encapsulation layer 112 is followed by masking and etching 500 of the encapsulation 112 and bottom electrode 104 layers as known in the art.

These masking and etching steps 300 and 500 are followed by the second RTA anneal 502.

This second RTA anneal 502, or grain grown anneal, anneals the top electrode layer and underlying PZT together by rapid thermal anneal at a temperature and for a duration sufficient for grain growth of the PZT to complete. This anneal is at a temperature of greater than six hundred twenty five degrees C., generally being performed between seven hundred and seven hundred fifty degrees C. A temperature of seven hundred twenty five degrees for approximately twenty seconds has produced good results. Anneal times of more than ten seconds are required to avoid excessive variation in the anneal process, and less then forty seconds is preferred as longer anneal is unnecessary.

With this alternative process of FIG. 5 the etch damage recovery anneal 216 of the process of FIG. 2 is no longer necessary and is eliminated. Similarly the etch recovery anneal 406, as required by the processes of FIGS. 2, 3, and 4 is also not necessary and is eliminated. The second RTA anneal 502 is followed by processing of contacts and higher interconnect layers 504 as with the other alternative processes herein described.

The processes have been described with reference to a platinum electrically conductive bottom electrode layer and an iridium oxide electrically conductive top electrode layer. It is expected that at least some other metallic and nonmetallic electrically conductive substances, including iridium and similar noble metals, may also produce operable ferroelectric capacitor bottom electrodes. Similarly, it is expected that at least some other noble metal oxides may also produce operable ferroelectric capacitor top electrodes. It is required, however, that the bottom and top electrode layers have a melting point greater than the temperatures of the rapid thermal anneal processing steps performed after, these layers are deposited.

The process has been described with reference to sputter deposition of the various layers. It is expected that the process may function with other methods of deposition, including chemical vapor deposition (CVD) or solution chemistry deposition (spin-on) techniques, as appropriate for the various layers and as known in the art.

Rapid thermal anneal (RTA) as used herein is a heat treatment technique that relies on thermally heating at least one surface of an object through exposure to infrared radiation, whether that radiation is produced by heatlamps or by a laser.

While the invention has been particularly shown and described with reference to a preferred embodiment thereof, it will be understood by those skilled in the art that various other changes in the form and details may be made without departing from the spirit and scope of the invention.

We claim:

1. A method for fabrication of ferroelectric capacitor elements of an integrated circuit comprising:

deposition of an electrically conductive bottom electrode layer;

deposition of a layer of ferroelectric dielectric material;

annealing the layer of ferroelectric dielectric material to form perovskite phases with a first anneal at a first temperature;

deposition of an electrically conductive top electrode layer; and annealing the layer of ferroelectric dielectric material with a second anneal at a second temperature higher than the first temperature, the second anneal changing the layer of ferroelectric material into grains having a columnar structure, being performed by rapid thermal annealing and performed after the step of deposition of an electrically conductive top electrode layer.

2. The process of claim 1, wherein the electrically conductive bottom electrode layer comprises a noble metal.

3. The process of claim 2, wherein the electrically conductive bottom electrode layer comprises platinum.

4. The process of claim 1, wherein the ferroelectric dielectric layer comprises PZT.

5. The process of claim 1 wherein the electrically conductive top electrode layer comprises a noble metal oxide.

6. The process of claim 5 wherein the electrically conductive top electrode layer comprises Iridium Oxide.

7. The process of claim 5 wherein the first anneal comprises a rapid thermal anneal at a temperature between five hundred twenty five and six hundred degrees celsius.

8. The process of claim 1, wherein the first anneal is performed by rapid thermal annealing.

9. The process of claim 7 wherein the second anneal is performed at a temperature of between seven hundred and seven hundred fifty degrees celsius.

10. The process of claim 9, wherein the second anneal is performed at a temperature of approximately seven hundred twenty five degrees celsius for a duration of greater than ten seconds.

11. A method for fabrication of ferroelectric capacitor elements of an Integrated circuit comprising:

deposition of an electrically conductive bottom electrode layer comprising a noble metal;

deposition of a layer of ferroelectric dielectric material;

annealing the layer of ferroelectric dielectric material to form perovskite phases with a first anneal in an environment comprising oxygen at a first partial pressure;

deposition of an electrically conductive top electrode layer comprising a noble metal oxide; and annealing the layer of ferroelectric dielectric material with a second anneal, the second anneal changing the layer of ferroelectric material into grains having a columnar structure, being performed in an environment comprising oxygen, the oxygen having a second partial pressure less than the first partial pressure and performed after the step of deposition of an electrically conductive top electrode layer.

12. The process of claim 11, wherein the second anneal is performed by rapid thermal annealing.

13. The process of claim 11 wherein the first partial pressure is less than ten percent of one atmosphere.

14. The process of claim 11 wherein the first anneal is performed by rapid thermal annealing.

15. The process of claim 11 wherein the second anneal is performed in an environment comprising a mixture of oxygen and inert gas.

16. The process of claim 11 wherein the second partial pressure is less then five percent of one atmosphere.

17. The process of claim 11 wherein the first anneal is performed in an environment comprising a mixture of oxygen and inert gas.

18. The process of claim 11 wherein the second anneal is performed at a temperature of between seven hundred and seven hundred fifty degrees celsius for a time not less than ten seconds.

19. The process of claim 11 wherein the step of depositing the ferroelectric dielectric layer is performed by sputtering.

20. A method for fabrication of ferroelectric capacitor elements of an Integrated circuit comprising:

deposition of an electrically conductive bottom electrode layer comprising a noble metal:

deposition of a layer of ferroelectric dielectric material by a sputtering method;

annealing the layer of ferroelectric dielectric material to form perovskite phases with a first anneal at a first temperature;

deposition of an electrically conductive top electrode layer comprising a noble metal oxide; and annealing the layer of ferroelectric dielectric material with a second anneal at a second temperature higher than the first temperature, the second anneal changing the layer of ferroelectric material into grains having a columnar structure, being performed by rapid thermal annealing after the step of deposition of an electrically conductive top electrode layer.

* * * * *